US009012936B2

(12) United States Patent
Narita et al.

(10) Patent No.: US 9,012,936 B2
(45) Date of Patent: Apr. 21, 2015

(54) SAPPHIRE SUBSTRATE HAVING TRIANGULAR PROJECTIONS WITH PORTIONS EXTENDING IN DIRECTION OF SUBSTRATE CRYSTAL AXIS

(75) Inventors: Junya Narita, Yoshinogawa (JP); Takuya Okada, Tokushima (JP); Yohei Wakai, Anan (JP); Yoshiki Inoue, Anan (JP); Naoya Sako, Anan (JP); Katsuyoshi Kadan, Anan (JP)

(73) Assignee: Nichia Corporation, Anan-shi (JP)

( * ) Notice: Subject to any disclaimer, the term of this patent is extended or adjusted under 35 U.S.C. 154(b) by 181 days.

(21) Appl. No.: 13/204,317

(22) Filed: Aug. 5, 2011

(65) Prior Publication Data
US 2012/0074431 A1 Mar. 29, 2012

(30) Foreign Application Priority Data
Aug. 6, 2010 (JP) .................................. 2010-177007

(51) Int. Cl.
| H01L 21/02 | (2006.01) |
| H01L 33/10 | (2010.01) |
| H01L 33/00 | (2010.01) |
| H01L 33/20 | (2010.01) |
| H01L 33/32 | (2010.01) |

(52) U.S. Cl.
CPC ......... *H01L 33/10* (2013.01); *Y10T 428/24479* (2013.01); *H01L 21/0242* (2013.01); *H01L 21/0243* (2013.01); *H01L 21/02458* (2013.01); *H01L 21/0254* (2013.01); *H01L 33/007* (2013.01); *H01L 33/20* (2013.01); *H01L 33/32* (2013.01)

(58) Field of Classification Search
CPC . H01L 21/0243; H01L 21/02; H01L 21/0242; H01L 21/0254; H01L 21/02458; H01L 33/10; H01L 33/007; H01L 33/32
USPC ........ 257/98, E33.067, E51.021, E33.074, 79
See application file for complete search history.

(56) References Cited

U.S. PATENT DOCUMENTS

| 2003/0057444 A1* | 3/2003 | Niki et al. ..................... 257/200 |
| 2003/0170503 A1 | 9/2003 | Shibata et al. |
| 2004/0048471 A1 | 3/2004 | Okagawa et al. |

(Continued)

FOREIGN PATENT DOCUMENTS

| JP | 2001-053012 | 2/2001 |
| JP | 2002-164296 | 6/2002 |

(Continued)

OTHER PUBLICATIONS

International Search Report in PCT/JP2011/067956 dated Nov. 1, 2011.

(Continued)

*Primary Examiner* — Peter Bradford
(74) *Attorney, Agent, or Firm* — Foley & Lardner

(57) ABSTRACT

The sapphire substrate has a principal surface for growing a nitride semiconductor to form a nitride semiconductor light emitting device and comprising a plurality of projections of the principal surface, wherein an outer periphery of a bottom surface of each of the projections has at least one depression. This depression is in the horizontal direction. The plurality of projections are arranged so that a straight line passes through the inside of at least any one of projections when the straight line is drawn at any position in any direction in a plane including the bottom surfaces of the plurality of projections.

26 Claims, 12 Drawing Sheets

(56) References Cited

U.S. PATENT DOCUMENTS

| | | | |
|---|---|---|---|
| 2005/0001227 A1 | 1/2005 | Niki et al. | |
| 2005/0179130 A1* | 8/2005 | Tanaka et al. | 257/730 |
| 2005/0196888 A1* | 9/2005 | Morita | 438/44 |
| 2006/0054942 A1 | 3/2006 | Nakahata | |
| 2007/0170550 A1 | 7/2007 | Takase | |
| 2008/0303042 A1 | 12/2008 | Minato et al. | |
| 2009/0032835 A1* | 2/2009 | Park | 257/103 |
| 2010/0059773 A1 | 3/2010 | Cheng et al. | |
| 2010/0096657 A1* | 4/2010 | Ou et al. | 257/98 |
| 2010/0162957 A1 | 7/2010 | Boyd et al. | |
| 2010/0163901 A1 | 7/2010 | Fudeta | |
| 2010/0187542 A1 | 7/2010 | Ichihara et al. | |
| 2010/0255621 A1 | 10/2010 | Minato et al. | |
| 2011/0198560 A1* | 8/2011 | Okagawa et al. | 257/13 |

FOREIGN PATENT DOCUMENTS

| | | | |
|---|---|---|---|
| JP | 2002-280611 | 9/2002 | |
| JP | 2003-318441 | 11/2003 | |
| JP | 2004-031405 | 1/2004 | |
| JP | 2004-142953 | 5/2004 | |
| JP | 2005-011944 | 1/2005 | |
| JP | 2005-047718 | 2/2005 | |
| JP | 2005-101566 | 4/2005 | |
| JP | 2007-194450 | 8/2007 | |
| JP | 2008-010894 | 1/2008 | |
| JP | 2008-177528 | 7/2008 | |
| JP | 20087192690 | 8/2008 | |
| JP | 2010-171382 | 8/2010 | |
| WO | WO-2009/020033 A1 | 2/2009 | |
| WO | WO 2009102033 A1 * | 8/2009 | C23C 16/30 |

OTHER PUBLICATIONS

Translation of the International Preliminary Examination Report on Patentability PCT/JP2011/067956 dated Mar. 12, 2013.
Office Action in U.S. Appl. No. 13/831,211 dated Oct. 3, 2013.
Office Action in U.S. Appl. No. 13/831,138 dated Oct. 4, 2013.
Notice of Allowance received in U.S. Appl. No. 13/831,138 dated Jun. 4, 2014.
Notice of Allowance received in U.S. Appl. No. 13/831,211 dated Jun. 4, 2014.
U.S. Office Action dated Nov. 14, 2014 issued in U.S. Appl. No. 14/314,516.

* cited by examiner (a)          (b)

SAPPHIRE SUBSTRATE HAVING TRIANGULAR PROJECTIONS WITH PORTIONS EXTENDING IN DIRECTION OF SUBSTRATE CRYSTAL AXIS

TECHNICAL FIELD

The present invention relates to a sapphire substrate for a nitride semiconductor light emitting device, and a semiconductor light emitting device.

BACKGROUND ART

For example, a light emitting diode (LED) made of a nitride semiconductor is usually constituted by sequentially laminating an n-type semiconductor layer, an active layer and a p-type semiconductor layer on a sapphire substrate. In this light emitting diode, emitted light is extracted from the side opposite the sapphire substrate or the side of the sapphire substrate, while light emitted from the active layer is also radiated in a direction opposite the light emission side. Therefore, it becomes necessary to improve external quantum efficiency by enabling light radiated in a direction opposite the light emission side to extract effectively from the light emission side.

For example, Patent Document 1 discloses that external quantum efficiency is improved by arranging a plurality of projections having truncated triangular pyramid-shaped on a sapphire substrate. Patent Document 1 also describes that generation of voids and deterioration of crystallinity can be suppressed by enabling crystal growth on a surface, on which projections having a truncated triangular pyramid shaped are formed, through the projections.

PRIOR ART DOCUMENTS

Patent Documents

Patent Document 1: JP-A-2008-177528

Disclosure of the Invention

Problems to be Solved by the Invention

However, the present inventors have intensively studied and found that, in a light emitting diode composed of a nitride semiconductor grown on a surface including projections having a truncated triangular pyramid shape, was not necessarily possible that light emitted in the direction opposite the light emission side is efficiently extracted from the light emission side, and external quantum efficiency is sufficiently improved.

Thus, an object of the present invention is to provide a sapphire substrate for a nitride semiconductor light emitting device, that can constitute a nitride semiconductor light emitting device having excellent light extraction efficiency.

Another object of the present invention is to provide a semiconductor light emitting device having excellent light extraction efficiency.

Means for Solving the Problems

In order to achieve the above objects, the sapphire substrate according to the present invention is a sapphire substrate having a principal surface for growing a nitride semiconductor to form a nitride semiconductor light emitting device and comprising a plurality of projections on the principal surface, wherein an outer periphery of a bottom surface of each of the projections has at least one depression. This depression does not mean a depression in a vertical direction to a sapphire substrate, but means a depression in a horizontal direction.

The plurality of projections are arranged so that a straight line passes through the inside of at least any one of projections when the straight line is drawn at any position in any direction in a plane including the bottom surfaces of the plurality of projections.

The projections have a substantially polygonal cone shape or substantially polygonal truncated pyramidal shape whose bottom surface has a substantially polygonal shape, respectively, and each side of the bottom surface includes a depression in the center.

The semiconductor light emitting device according to the present invention is characterized in that a nitride semiconductor layer light emitting device is formed by growing a nitride semiconductor on one principal surface of the sapphire substrate according to the present invention.

Effects of the Invention

The sapphire substrate constituted as described above according to the present invention has a principal surface comprising a plurality of projections for growing a nitride semiconductor to form a nitride semiconductor light emitting device and an outer periphery of a bottom surface of each of the projections has at least one depression. Therefore, light emitted in parallel to the sapphire substrate on a surface thereof is irradiated on projections, and thus it is possible to provide a sapphire substrate for a nitride semiconductor light emitting device, that can constitute a nitride semiconductor light emitting device having excellent light extraction efficiency.

In the sapphire substrate, the plurality of projections are arranged so that a straight line passes through the inside of at least any one of projections when the straight line is drawn at any position in any direction in a plane including a bottom surface of the plurality of projections. Therefore, when a nitride semiconductor light emitting device is constituted on one principal surface, light, that propagates in parallel and proximal to one principal surface, is reflected by at least one of projections even if light propagates in any direction.

Accordingly, the sapphire substrate according to the present invention can provide a sapphire substrate for a nitride semiconductor light emitting device, that can constitute a nitride semiconductor light emitting device having excellent light extraction efficiency.

In the sapphire substrate, each of the projections has a substantially polygonal cone shape or substantially polygonal truncated pyramidal shape whose bottom surface has a substantially polygonal shape, and each side of the bottom surface includes a depression in the center. Therefore, it is possible to easily realize the arrangement of projections so that a straight line passes through the inside of at least any one of projections when the straight line is drawn at any position in any direction in a plane including a bottom surface of the plurality of projections.

In the light emitting device according to the present invention, a nitride semiconductor layer light emitting device is formed by growing a nitride semiconductor on one principal surface of the sapphire substrate according to the present invention. Therefore, it is possible to provide a semiconductor light emitting device having excellent light extraction efficiency.

MODE FOR CARRYING OUT THE INVENTION

Figure 1:
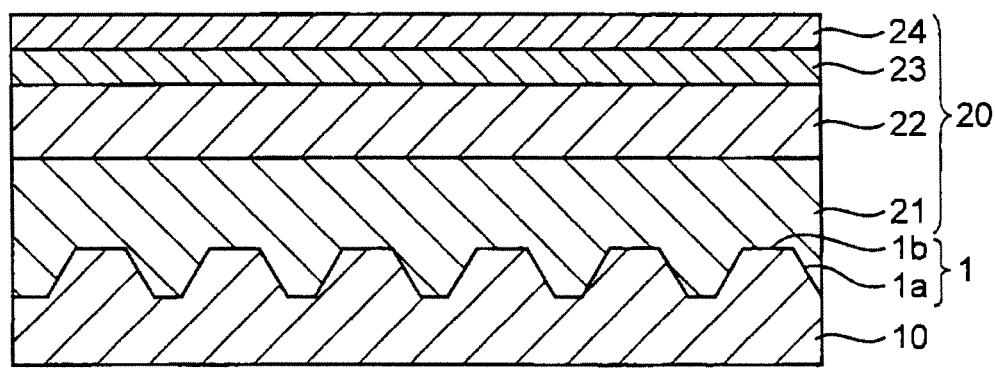
FIG. 1 is a sectional view of a nitride semiconductor light emitting device according to the embodiment of the present invention.

As shown in FIG. 1, the nitride semiconductor light emitting device according to the embodiment of the present invention is provided with a semiconductor laminated structure 20 in which a base layer 21, a first conductive layer (n-type layer) 22, an active layer (emissive layer) 23 and a second conductive layer (p-type layer) 24 are sequentially laminated on a sapphire substrate 10, and a plurality of projections (dimples) 1, each having a pyramidal shape or a trapezoidal conical shape, are provided on a surface of the substrate 10 on which the base layer 21 is grown.

Herein, particularly in the present embodiment, a plurality of projections 1 are arranged so that light, that propagates in parallel to the surface of the substrate located between adjacent projections 1 and proximal to the surface of the substrate, is reflected by at least one of projections even if light propagates in any direction.

Whereby, the nitride semiconductor light emitting device of the present embodiment enables light emitted in the emissive layer 23 to efficiently reflect in the light emission direction without being emitted from the side by a plurality of projections 1, and thus light extraction efficiency can be increased.

Specific arrangement example of projections 1 in a sapphire substrate according to the embodiment of the present invention will be described below.

In the present invention, the projection 1 may have a substantially n-sided pyramidal shape, or a substantially truncated n-sided pyramidal shape including a top surface 1b that is substantially parallel to a bottom surface and has a shape substantially similar to that of the bottom surface, and each bottom surface may have a substantially n-sided polygon shape including n sides, each having an outwardly bulged circular arc shape. In the following descriptions of Embodiments 1 to 6, description is made using an example of the projection 1 having a typical substantially triangular pyramidal shape or a substantially truncated triangular pyramidal shape.

In the drawings to be referred in Embodiments 1 to 6, a planar shape (a shape of a bottom surface) of the projection 1 is schematically shown by regular triangle. When a projection 1 having a substantially triangular pyramidal shape or a substantially truncated triangular pyramidal shape is formed by etching a sapphire substrate, each side of a bottom surface thereof usually becomes a side having an outwardly bulged circular arc shape and an inclined side of the projection 1 becomes an outwardly bulged surface.

Embodiment 1

Figure 2:
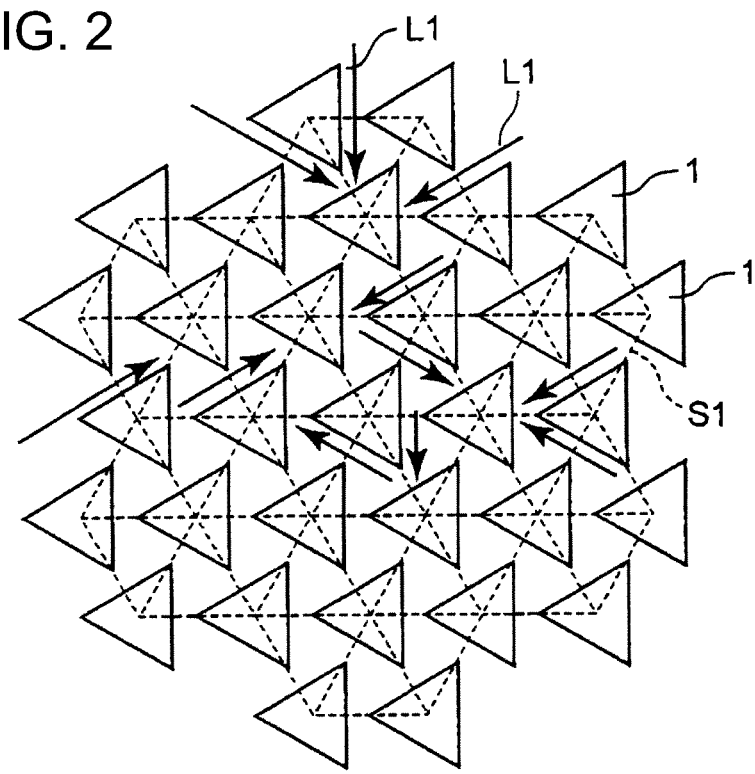
FIG. 2 is a plan view showing the arrangement of projections in a sapphire substrate according to Embodiment 1 of the present invention.

In a plan view of FIG. 2, the arrangement of projections 1 in a sapphire substrate according to the embodiment 1 of the present invention is shown.

In the present Embodiment 1, a plurality of projections 1, each having a substantially triangular pyramidal shape, are arranged so that gravity of a bottom surface agrees with each lattice point of a triangular lattice having a lattice shape of regular triangle. In Embodiment 1, projections 1 are arranged on the lattice point of a triangular lattice so that all projections 1 face the same direction. In the present description, the direction of projections 1 refers to the direction in which a line, that bisect an angle of a vertex of a bottom surface, faces outside from the inside of projections 1, and two or more projections 1 facing the same direction refers that all directions corresponding between projections 1 face the same direction. In other words, it refers that projections are arranged in a state where projections can be superposed on a bottom surface of other all projections 1 by parallel translation without rotating the bottom surface.

The plurality of projections 1 thus arranged of Embodiment 1 are arranged so as to form a plurality of rows, and are respectively arranged so that a bisector that bisects an angle of one of vertexes of projections 1 arranged in the same line is located on a straight line, and also the projection direction defined by the direction, in which the bisector faces outside from the inside of projections 1, becomes the same, even in case of looking at the row in any direction.

In the present Embodiment 1, in addition to the above arrangement, the size of projections 1 is set so that a straight line necessarily passes through the inside of any one of projections 1 when the straight line is drawn at any position in any direction in the plane including a bottom surface of projections 1.

Using a sapphire substrate including a plurality of projections 1 having the size set as described above and arranged as shown in FIG. 2, when a semiconductor laminated structure 20, in which a base layer 21, a first conductive layer (n-type layer) 22, an active layer (emissive layer) 23 and a second conductive layer (p-type layer) 24 are sequentially formed on one principal surface on which plurality of projections 1 are formed, is constituted and thus a nitride semiconductor light emitting device is constituted, light emitted on the sapphire substrate side among light emitted in the emissive layer 23 is reflected by at least one of projections 1, even if light L1, that propagates in parallel to the surface of the substrate located between adjacent projections 1 and proximal to the surface of the substrate, propagates in any direction.

Accordingly, the nitride semiconductor light emitting device constituted using the sapphire substrate of the present Embodiment 1 enables light to efficiently reflect in the light emission direction without being emitted from the side by the presence of the above arranged plurality of projections 1, and thus light extraction efficiency can be increased.

In the sapphire substrate of the present Embodiment 1, projections 1 are arranged comparatively densely by the above arrangement and the proportion occupied by the plurality of projections 1 provided on one principal surface based on the entire one principal surface of the sapphire substrate increases, and thus enabling the growth of a nitride semiconductor with low dislocation, resulting in high luminous efficiency of the nitride semiconductor light emitting device.

Embodiment 2

Figure 3:
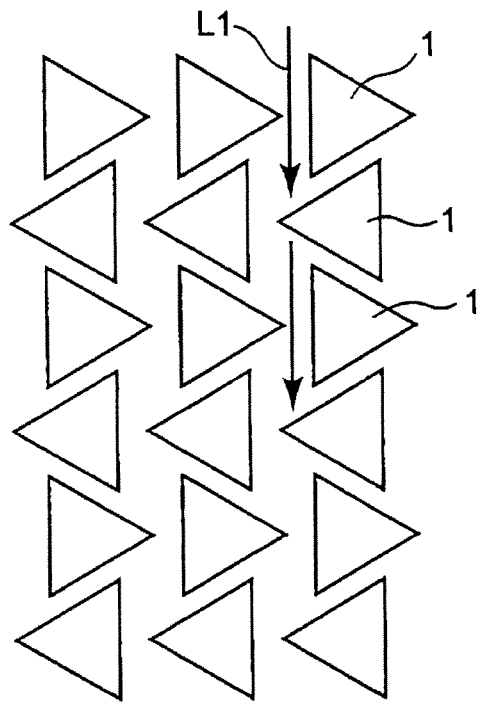
FIG. 3 is a plan view showing the arrangement of projections in a sapphire substrate according to Embodiment 2 of the present invention.

In a plan view of FIG. 3, the arrangement of projections 1 in a sapphire substrate according to Embodiment 2 of the present invention is shown.

The arrangement of FIG. 3 is composed of a plurality of rows that are respectively constituted by a plurality of projections 1. The plurality of projections 1 arranged in the same row are respectively arranged so that a bisector that bisects an angle of one of vertexes of the projections is located on a straight line and also the projection direction defined by the direction, in which the bisector faces outside from the inside of projections 1, becomes the same. The arrangement direction of projections 1 of odd numbered rows is opposite to the arrangement direction of projections 1 of even numbered rows. That is, the direction of projections 1 in each column is opposite between adjacent columns.

The size of a bottom surface of the respective projections 1 is set so that a straight line passes through the inside of any one of projections 1 even if the straight line is drawn at any position in parallel to the row and the straight line is drawn at any position in parallel to the column.

Using a sapphire substrate including a plurality of projections 1 having the size set as described above and arranged as shown in FIG. 3, when a semiconductor laminated structure 20, in which a base layer 21, a first conductive layer (n-type layer) 22, an active layer (emissive layer) 23 and a second conductive layer (p-type layer) 24 are sequentially formed on one principal surface on which plurality of projections 1 are formed, is constituted and thus a nitride semiconductor light emitting device is constituted, light emitted on the sapphire substrate side among light emitted in the emissive layer 23 is reflected by at least one of projections 1, even if light L1, that propagates in parallel to the surface of the substrate located between adjacent projections 1 and proximal to the surface of the substrate, propagates in any direction.

Accordingly, the nitride semiconductor light emitting device constituted using the sapphire substrate of the present Embodiment 2 enables light to efficiently reflect in the light emission direction without being emitted from the side by the presence of the above arranged plurality of projections 1, and thus light extraction efficiency can be increased.

In the sapphire substrate of the present Embodiment 2, projections 1 are arranged comparatively densely by the above arrangement and the area occupied by the bottom surface of the plurality of projections 1 provided on one principal surface based on the entire one principal surface of the sapphire substrate increases, and thus enabling the growth of a nitride semiconductor with low dislocation, resulting in high luminous efficiency of the nitride semiconductor light emitting device.

Embodiment 3

Figure 4:
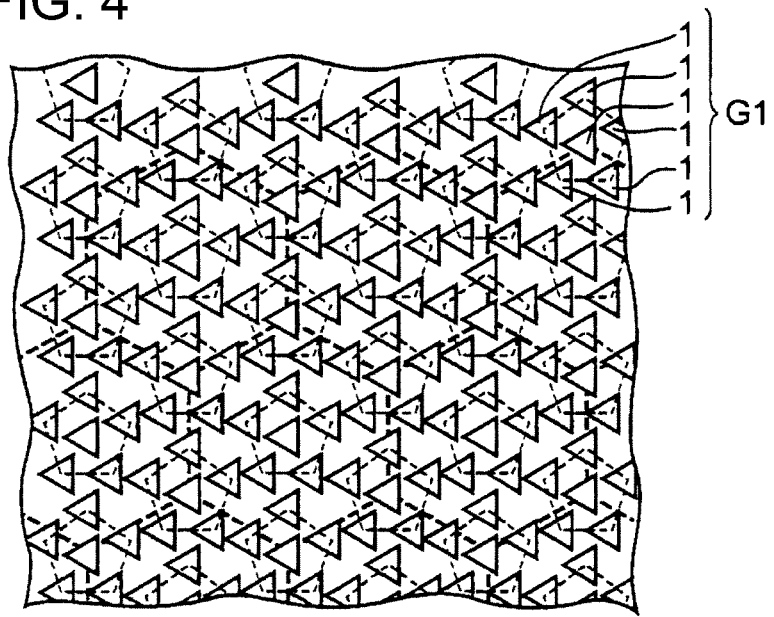
FIG. 4 is a plan view showing the arrangement of projections in a sapphire substrate according to Embodiment 3 of the present invention.

In a plan view of FIG. 4, the arrangement of projections 1, each having a substantially triangular pyramidal shape, in a sapphire substrate according to Embodiment 3 of the present invention is shown. In the present Embodiment 3, a group G1 composed of six projections 1 as a plurality of projections 1, arranged so that gravity of a bottom surface of each projection agrees with a vertex and a center of regular pentagon, is repeatedly arranged in accordance with a fixed rule.

In the present Embodiment 3, regular pentagon in which six projections 1 are arranged, is arranged in a sense (the same sense) that enables superposition on the other regular pentagon by parallel translation without rotation.

Regular pentagon is arranged so that the center of each regular pentagon agrees with a vertex of a triangular lattice point, and also projections 1 are separated and do not overlap between adjacent groups G1.

Furthermore, regarding the size of each projection 1, the size of the bottom surface of each projection 1 is set so that a straight line passes through the inside of any one of projections 1 when the straight line is optionally drawn on one principal surface.

Using a sapphire substrate including a plurality of projections 1 having the size set as described above and arranged as shown in FIG. 4, when a semiconductor laminated structure 20, in which a base layer 21, a first conductive layer (n-type layer) 22, an active layer (emissive layer) 23 and a second conductive layer (p-type layer) 24 are sequentially formed on one principal surface on which plurality of projections 1 are formed, is constituted and thus a nitride semiconductor light emitting device is constituted, light emitted on the sapphire substrate side among light emitted in the emissive layer 23 is reflected by at least one of projections 1, even if light L1, that propagates in parallel to the surface of the substrate located between adjacent projections 1 and proximal to the surface of the substrate, propagates in any direction.

Accordingly, the nitride semiconductor light emitting device constituted using the sapphire substrate of the present Embodiment 3 enables light to efficiently reflect in the light emission direction without being emitted from the side by the presence of the above arranged plurality of projections 1, and thus light extraction efficiency can be increased.

In the sapphire substrate of the present Embodiment 3, projections 1 are arranged comparatively densely by the above arrangement and the area occupied by the bottom surface of the plurality of projections 1 provided on one principal surface based on the entire one principal surface of the sapphire substrate increases, and thus enabling the growth of a nitride semiconductor with low dislocation, resulting in high luminous efficiency of the nitride semiconductor light emitting device.

Embodiment 4

Figure 5:
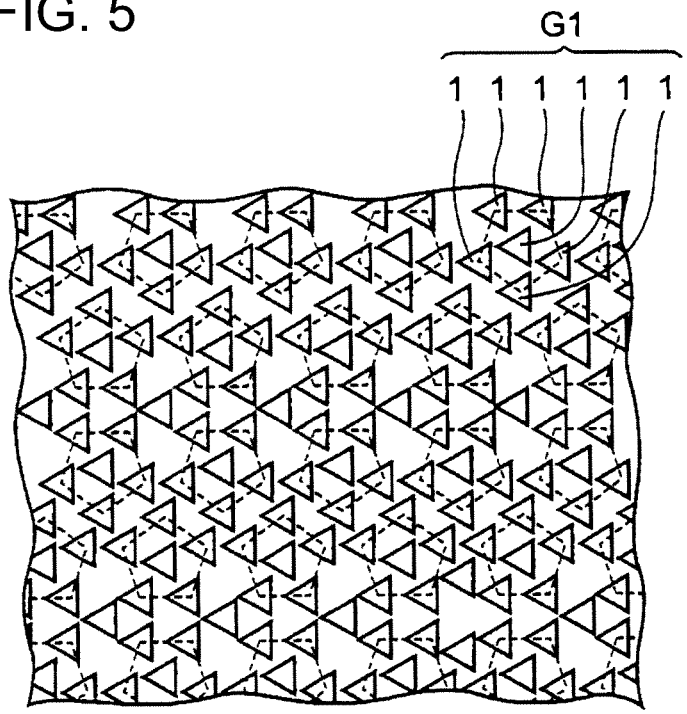
FIG. 5 is a plan view showing the arrangement of projections in a sapphire substrate according to Embodiment 4 of the present invention.

In a plan view of FIG. 5, the arrangement of projections 1 in a sapphire substrate according to the embodiment 4 of the present invention is shown. The sapphire substrate of the present Embodiment 4 is the same as in Embodiment 3 in that it includes a plurality of groups G1 composed of six projections 1 arranged on the vertex and center of regular pentagon, but is different in the rule when the group G1 is repeatedly arranged.

That is, in the sapphire substrate of Embodiment 4, as shown in FIG. 5, a plurality of groups G1 arranged in the first row (uppermost row in the drawing) are juxtaposed so that regular pentagon, that determines the arrangement of projections 1, becomes the same sense.

A plurality of groups G1 arranged in the subsequent second row are juxtaposed so that regular pentagon, that determines the arrangement of each group G1, faces opposite to regular pentagon, that determines the arrangement of the group G1 arranged in the first row, relative to the group G1 arranged in the first row.

At this time, the arrangement position of the group G1 arranged in the first row and that of the group G1 arranged in the second row are set so that the center of regular pentagon, that determines the arrangement of the group G1 arranged in the first row, and the center of regular pentagon, that determines the arrangement of the group G1 arranged in the second row, are located at the vertex of triangular lattice.

Furthermore, as shown in FIG. 5, the arrangement in the third row and that of the fourth row are set so that the third row and the fourth row become linear symmetry. Hereinafter, the arrangement of projections 1 in the sapphire substrate of Embodiment 4 is set by repeating the arrangement similar to that in the first row to fourth row.

Similar to Embodiment 3, regarding the size of each projection 1, the size of the bottom surface of each projection 1 is set so that a straight line passes through the inside of a bottom surface of at least one of projections 1 when the straight line is optionally drawn on one principal surface.

The nitride semiconductor light emitting device thus constituted using a sapphire substrate of the present Embodiment 4 including a plurality of projections 1 having the size set as described above and arranged as shown in FIG. 5 enables light to efficiently reflect in the light emission direction without being emitted from the side by a plurality of projections 1, and thus light extraction efficiency can be increased.

In the sapphire substrate of the present Embodiment 4, projections 1 are arranged comparatively densely by the above arrangement and the area occupied by the bottom surface of the plurality of projections 1 provided on one principal surface based on the entire one principal surface of the sapphire substrate increases, and thus enabling the growth of a nitride semiconductor with low dislocation, resulting in high luminous efficiency of the nitride semiconductor light emitting device.

Embodiment 5

Figure 6:
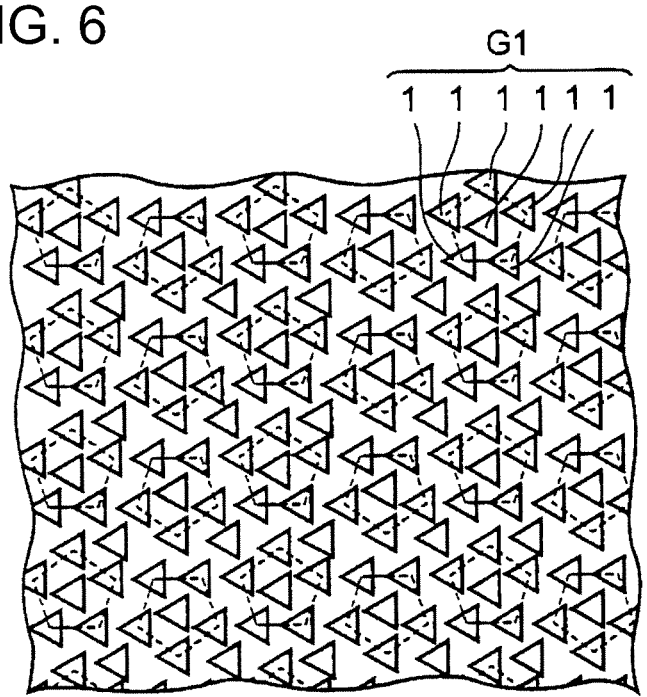
FIG. 6 is a plan view showing the arrangement of projections in a sapphire substrate according to Embodiment 5 of the present invention.

In a plan view of FIG. 6, the arrangement of projections 1 in a sapphire substrate according to Embodiment 5 of the present invention is shown. In the present Embodiment 5, a group G1 composed of six projections 1 as a plurality of projections 1 arranged so that gravity of a bottom surface of each projection agrees with a vertex and a center of regular pentagon is repeatedly arranged in accordance with a fixed rule that is different from in Embodiments 3 and 4.

In the present Embodiment 5, the group G1 arranged in the same column is arranged in the same direction without rotating, and the group G1 is arranged between adjacent columns in a reverse sense.

The group G1 arranged in even numbered columns is arranged slightly downward as compared with the group G1 arranged in add numbered columns. As a result, the sense of the group G1 arranged in each row becomes reverse between adjacent rows, and a line connecting centers of regular pentagons, that determine the arrangement of the group G1 in each row, becomes a bent line (zigzag line).

Furthermore, regarding the size of each projection 1, the size of the bottom surface of each projection 1 is set so that a straight line passes through the inside of any one of projections 1 when the straight line is optionally drawn on a plane including a bottom surface of projection 1.

Using a sapphire substrate including a plurality of projections 1 having the size set as described above and arranged as shown in FIG. 6, when a semiconductor laminated structure 20, in which a base layer 21, a first conductive layer (n-type layer) 22, an active layer (emissive layer) 23 and a second conductive layer (p-type layer) 24 are sequentially formed on one principal surface on which plurality of projections 1 are formed, is constituted and thus a nitride semiconductor light emitting device is constituted, light emitted on the sapphire substrate side among light emitted in the emissive layer 23 is reflected by at least one of projections 1, even if light L1, that propagates in parallel to the surface of the substrate located between adjacent projections 1 and proximal to the surface of the substrate, propagates in any direction.

Accordingly, the nitride semiconductor light emitting device constituted using the sapphire substrate of the present Embodiment 5 enables light to efficiently reflect in the light emission direction without being emitted from the side by the presence of the plurality of projections 1, and thus light extraction efficiency can be increased.

In the sapphire substrate of the present Embodiment 5, the area occupied by the bottom surface of the plurality of projections 1 provided on one principal surface based on the entire one principal surface of the sapphire substrate increases, and thus enabling the growth of a nitride semiconductor with low dislocation, resulting in high luminous efficiency of the nitride semiconductor light emitting device.

Embodiment 6

Figure 7:
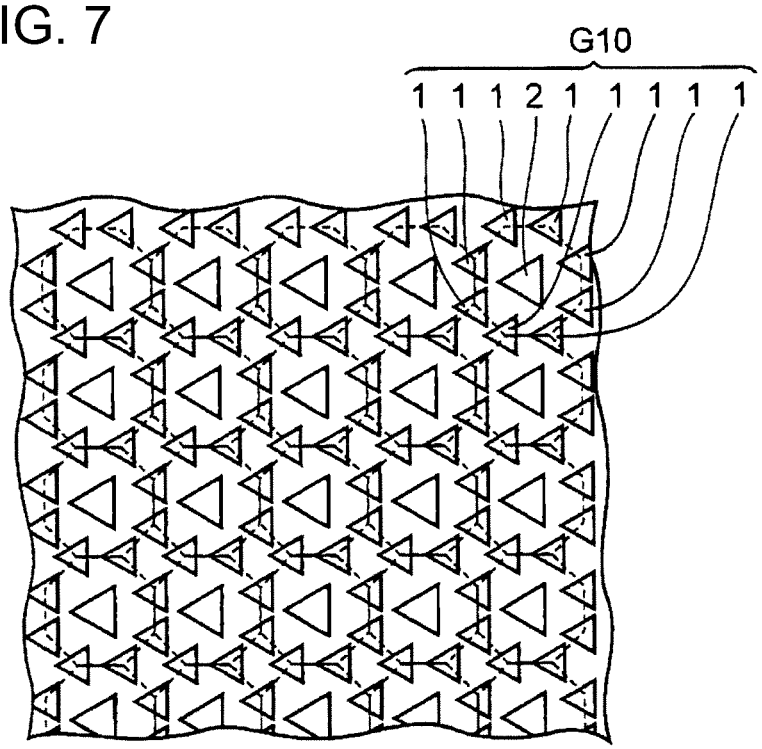
FIG. 7 is a plan view showing the arrangement of projections in a sapphire substrate according to Embodiment 6 of the present invention.

In a plan view of FIG. 7, the arrangement of projections 1 in a sapphire substrate according to Embodiment 6 of the present invention is shown. In the present Embodiment 6, a group G10, which is composed of eight projections 1 as a plurality of projections 1 arranged respectively on a vertex of regular octagon, and projections 2 composed of projections larger than the projections 1 arranged on the center of regular octagon, is repeatedly arranged in accordance with a fixed rule.

In the present Embodiment 6, the group G10 is repeatedly arranged in two directions of a row and a column, that intersect with each other, and respectively shares two projections 1 between adjacent two groups G10 in the same row and between adjacent two groups G10 in the same column.

Furthermore, the size of each projection 1 and the size of each projection 2 are set so that a straight line passes through the inside of projections 1 or projections 2 when the straight line is optionally drawn on one principal surface including a bottom surface of projections 1.

Using a sapphire substrate including projections 1 and projections 2, each having the size set as described above, and also including a plurality of projections 1 arranged as shown in FIG. 7, when a semiconductor laminated structure 20, in which a base layer 21, a first conductive layer (n-type layer) 22, an active layer (emissive layer) 23 and a second conductive layer (p-type layer) 24 are sequentially formed on one principal surface on which plurality of projections 1 are formed, is constituted and thus a nitride semiconductor light emitting device is constituted, light emitted on the sapphire substrate side among light emitted in the emissive layer 23 is reflected by at least one of projections 1, even if light L1, that propagates in parallel to the surface of the substrate located between adjacent projections 1 and proximal to the surface of the substrate, propagates in any direction.

Accordingly, the nitride semiconductor light emitting device constituted using the sapphire substrate of the present Embodiment 6 enables light to efficiently reflect in the light emission direction without being emitted from the side by the plurality of projections 1 and projections 2, and thus light extraction efficiency can be increased.

In the sapphire substrate of the present Embodiment 6, the area occupied by the bottom surface of the plurality of projections 1 provided on one principal surface based on the entire one principal surface of the sapphire substrate increases, and thus enabling the growth of a nitride semiconductor with low dislocation, resulting in high luminous efficiency of the nitride semiconductor light emitting device.

Embodiment 7

Figure 9:
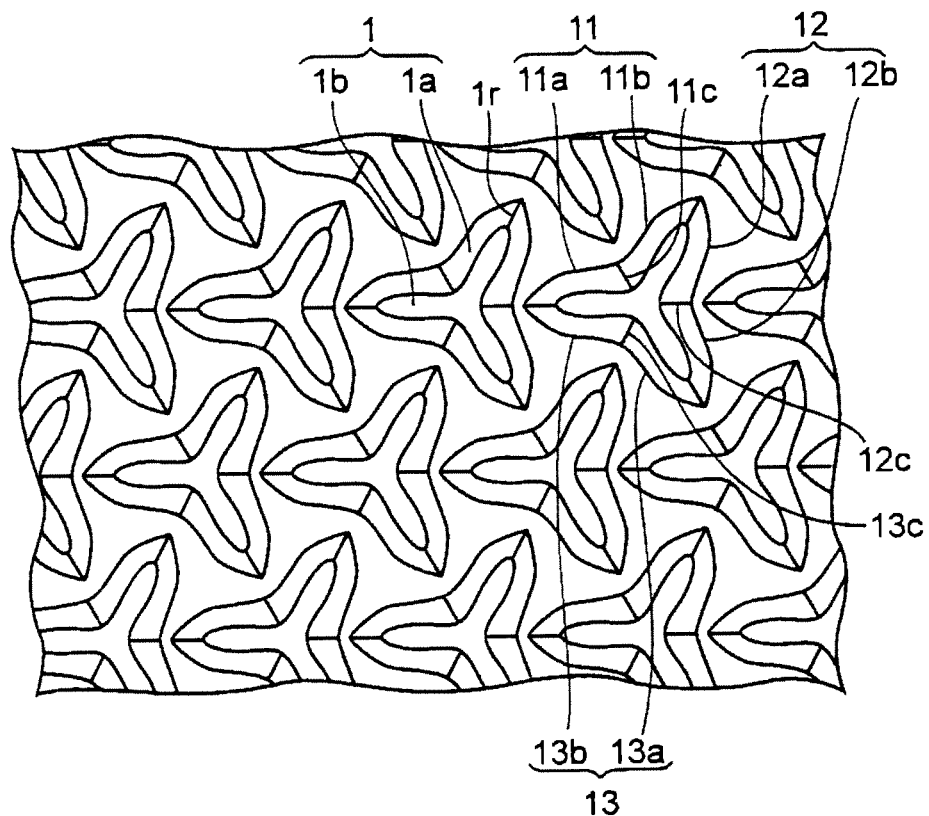
FIG. 9 is a plan view showing the constitution and arrangement of projections in a sapphire substrate according to Embodiment 7 of the present invention.

In a plan view of FIG. 9, the shape and the arrangement of projections 1 in a sapphire substrate according to Embodiment 7 of the present invention are shown.

As shown in FIG. 9, a bottom surface and a top surface of projections of Embodiment 7 have a truncated triangular pyramidal shape modified as described hereinafter. Therefore, it is possible to easily realize the arrangement of a plurality of projections 1, that enables light to be effectively reflected by projections 1, even if light L1, that propagates in parallel and proximal to a surface of the substrate, propagates in any direction, and thus light extraction efficiency can be improved.

<Shape of Projections 1>

The bottom surface of projections of Embodiment 7 has a substantially triangular shape in which each of sides 11, 12, 13 include a depression in the center.

Specifically, the side 11 is respectively composed of outwardly flanged two curved lines 11a, 11b, and a depression is formed at the connection portion thereof. Similarly, the side 12 is respectively composed of outwardly flanged two curved lines 12a, 12b, and a depression is formed at the connection portion thereof. The side 13 is respectively composed of outwardly flanged two curved lines 13a, 13b, and a depression is formed at the connection portion thereof.

The top surface of projections 1 of Embodiment 7 also has a substantially triangular shape, that is almost similar to that of the bottom surface including a depression in the center of each side.

In projections 1 of Embodiment 7, on the inclined side between the bottom surface and the top surface, a ridge connecting a vertex of the top surface to a vertex of the bottom surface, and a valley connecting the deepest portion of a depression of the bottom surface to the deepest portion of a depression of the top surface are formed.

In Embodiment 7, projections 1 constituted as described above are arranged so that one of vertexes of a bottom surface of one projection 1 is located (enter into) in a proximal region defined by connecting points of two vertexes of a bottom surface of the other projection 1 and the deepest point of a depression existing therebetween, between adjacent projections.

Whereby, a straight line can necessarily pass through the inside of any one of projections 1 when the straight line is drawn at any position in any direction in a plane including a bottom surface of projections 1.

In the present Embodiment 7, it is more preferred to arrange so that the deepest portion of a depression of the other projection 1 is located on an extended line of a line that bisect an angle of a vertex of one projection 1 located in the proximal region.

It is also preferred that each of projections 1 has a shape with linear symmetry to a straight line that connects a depression to a vertex to the side including the depression, and thus the above arrangement can be easily realized.

When a nitride semiconductor light emitting device is constituted using a sapphire substrate of Embodiment 7 in which the shape and the arrangement of projections 1 are set as described above, it is possible to reflect by projections 1 even if light L1, that propagates in parallel and proximal to a surface of the substrate, propagates in any direction.

Accordingly, the nitride semiconductor light emitting device constituted using a sapphire substrate of the present Embodiment 7 enables light to efficiently reflect in the light emission direction without being emitted from the side by a plurality of projections 1, and thus light extraction efficiency can be increased.

The area occupied by the bottom surface of the plurality of projections 1 provided on one principal surface based on the entire one principal surface in the sapphire substrate of the present Embodiment 7 increases, and thus enabling the growth of a nitride semiconductor with low dislocation, resulting in high luminous efficiency of the nitride semiconductor light emitting device.

Furthermore, in the sapphire substrate of the present Embodiment 7, for example, the height of the projection 1 can be decreased as compared with the projection having a triangular pyramidal shape. Therefore, it becomes possible to supply a raw gas, almost uniformly, to a growth surface (surface of a sapphire substrate located between projections 1) of a nitride semiconductor layer when a base layer 21 is grown on one principal surface on which a plurality of projections 1 are formed.

Whereby, it becomes possible to perform growth in a lateral direction, that uniformly covers projections 1 from the growth surface of a nitride semiconductor layer, and to decrease the height of projections 1, and thus a flat surface is obtained by a comparatively thin base layer 21.

Projections 1 having a petal shape in the present Embodiment 7 can be formed by setting a crystal form of a substrate and orientation of a surface of a substrate on which projections 1 are formed, mask shape and size, and etching conditions according to the objective shape.

Figure 8:
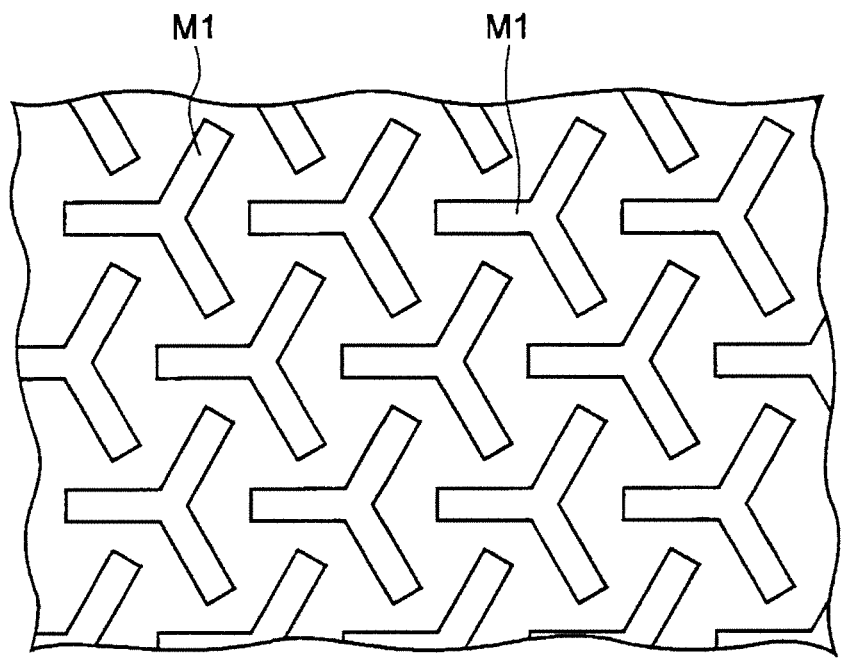
FIG. 8 is a plan view showing an example of a mask used when projections according to Embodiment 7 of the present invention is formed on a sapphire substrate.

In FIG. 8, an example of a mask M1 in case of forming projections 1 shown in FIG. 9 on a C-plane of a sapphire substrate is shown. The mask M1 of this example is composed of three legs (tripod shape), each having the same length and the same width, extending in three directions that change every 120 degrees from the center.

Using such a mask M1 having a tripod shape, when the C-plane surface of the sapphire substrate is wet-etched with sulfuric acid or phosphoric acid, a top surface 1b of projections 1 is formed, under the mask M1, into the shape in which the shape of the mask M1 right is modified, and an inclined side 1a with an end of the top surface of projections 1 as a top end is formed.

That is, the shape of the top surface of projections 1 is influenced by direction dependence of an etching rate due to a crystal form with the progress of etching, and thus it becomes the shape in which the tripod shape of the mask M1 is modified depending on etching characteristics. Whereby, the shape becomes a substantially triangular shape that includes a depression in the center of each side and also includes a sharpened vertex.

Similarly, the bottom surface of projections 1 also becomes a substantially triangular shape, that is almost similar to the shape of a top surface including a depression in the center of each side and also including a sharpened vertex, in which the tripod shape of the mask M1 is modified depending on etching characteristics.

Furthermore, due to direction dependence of the etching rate due to a crystal form, a ridge 1r connecting a vertex of the top surface to a vertex of the bottom surface, and a valley 12 connecting the deepest portion of a depression of the bottom surface to the deepest portion of a depression of the top surface are formed on the inclined side between the bottom surface and the top surface.

A ridge 1r protruding outwardly from a leg tip is formed at the tip portion (leg tip) of the leg of the mask M1, and inclined surfaces, each having a different inclination direction, are respectively formed on both sides of the ridge 1r. Accordingly, a plurality of masks M1 are formed so that a leg tip of one leg of the other mask M1 is proximal to or agrees with a straight line that connects angles of two leg tips of one mask M1, between adjacent masks M1, whereby, a plurality of projections 1 are arranged so that one of vertexes of a bottom surface of one projection 1 is located (enter into) in a proximal region defined by connecting points of two vertexes of a bottom surface of the other projection 1 and the deepest point of a depression existing therebetween, between adjacent projections.

The sense of projections 1 can be set to the desired sense by changing an off angle from a C-plane of a surface of a sapphire substrate on which projections 1 are formed.

While description was made by way of an example of the same arrangement of projections as in Embodiment 1 in the above Embodiment 7, the arrangement described in Embodiments 2 to 6 can also be applied.

Variation

While projections, each having a substantially polygonal pyramidal shape (particularly, substantially triangular pyramidal shape) whose bottom surface has a substantially polygonal shape (particularly, substantially triangular shape), were described in the above Embodiments 1 to 7, the present invention is not limited thereto. The projections may be either projections 31 whose bottom surface shape has a dogleg shape bent in the center as shown in FIG. 10, or projections 32 whose bottom surface shape has a cross shape as shown in FIG. 11.

Figure 10:
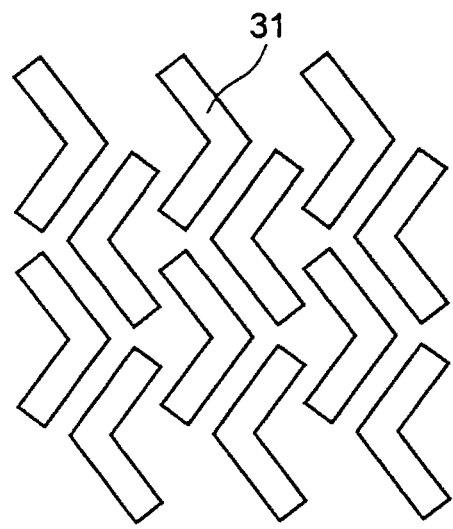
FIG. 10 is a plan view showing the constitution and arrangement of projections in a sapphire substrate according to Variation 1 of the present invention.
Figure 11:
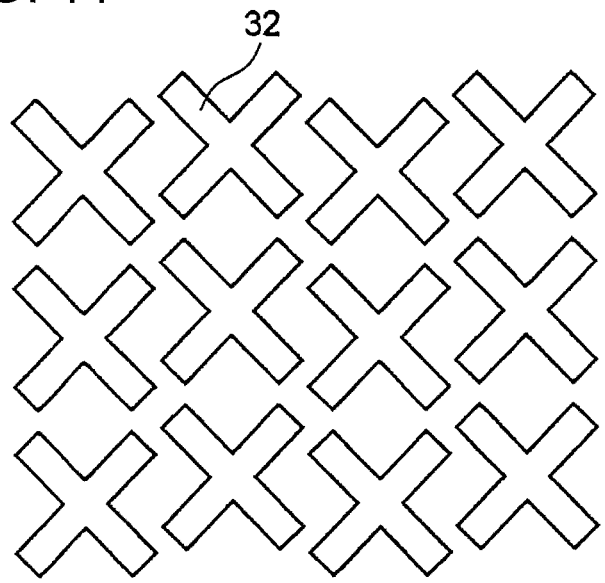
FIG. 11 is a plan view showing the constitution and arrangement of projections in a sapphire substrate according to Variation 2 of the present invention.

According to projections 31 whose bottom surface shape has a dogleg shape shown in FIG. 10, since at least one side of the bottom surface includes a depression in the center, a plurality of projections 31 can be arranged so that a straight line passes through the inside of at least any one of projections 31 when the straight line is drawn at any position in any direction on a surface of sapphire substrate on which projections 31 are formed.

Even in case of projections 32 (FIG. 11) whose bottom surface has a cross shape, each side of the bottom surface including a depression in the center, a plurality of projections 32 can be arranged so that a straight line passes through the inside of at least any one of projections 32 when the straight line is drawn at any position in any direction on a surface of sapphire substrate on which projections 32 are formed.

Embodiment 8

Figure 12:
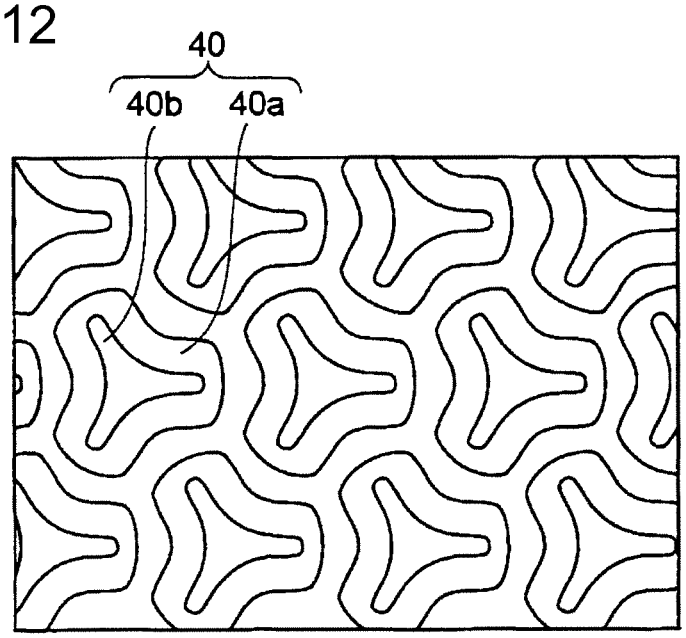
FIG. 12 is a plan view showing the constitution and arrangement of projections in a sapphire substrate according to Embodiment 8 of the present invention.

In a plan view of FIG. 12, the shape and the arrangement of projections 40 in a sapphire substrate according to Embodiment 8 of the present invention are shown.

Figure 15:
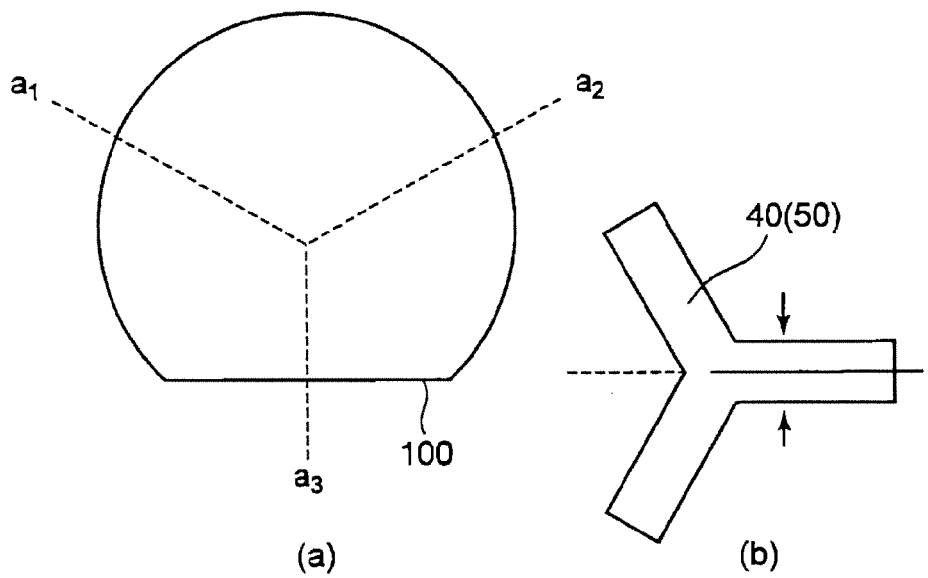
FIG. 15(a) is a plan view showing an orientation flat (plane A) and a crystal axis (axis a) of a sapphire wafer.
FIG. 15(b) is a plan view showing a direction of projections.

Projections 40 of Embodiment 8 are formed in the sense in which projections 1 of Embodiment 7 are rotated by 180 degrees. Herein, in the present description, the sense of projections is defined on the basis of an orientation flat (plane A) 100 of a sapphire substrate as shown in FIG. 15.

That is, both projections 40 of Embodiment 8 and projections 1 of Embodiment 7 are formed so that the direction of projections (three directions from the center toward the vertex of a substantially triangular shape in a bottom surface of the substantially triangular shape) and an axis "a" intersect with each other, but the direction of projections is opposite. As a result, the above three directions in projections 1 of Embodiment 7 agree with those in which the axis "a" (axis a1, axis a2 and axis a3) shown in FIG. 15 is rotated counter clockwise (left-handed) by 30 degrees, whereas, the above three directions in projections 40 of Embodiment 8 agree with those in which the axis "a" (axis a1, axis a2 and axis a3) shown in FIG. 15 is rotated clockwise (right-handed) by 30 degrees.

Figure 13:
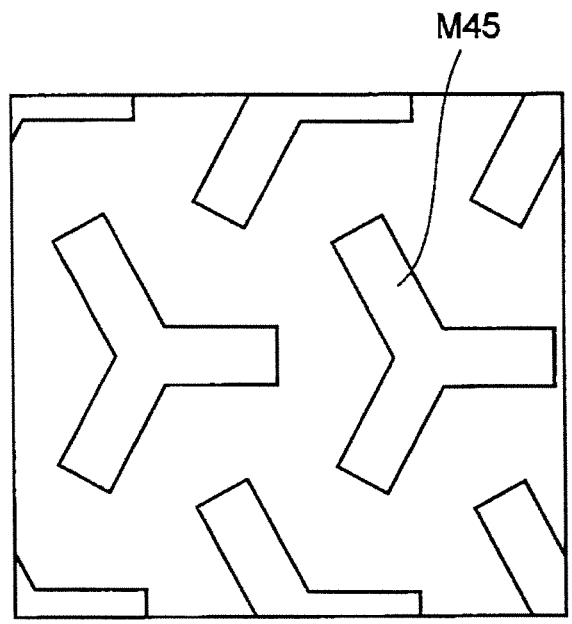
FIG. 13 is a plan view of a mask used when projections according to Embodiment 8 of the present invention is formed on a sapphire substrate.

Projections 40 of Embodiment 8 in which projections 1 are rotated by 180 degrees can be formed by forming a mask M45 extending in three directions that agree with the above three directions shown in FIG. 13 on a C-plane of a sapphire substrate, followed by etching.

As described above, the surface to be etched in the direction parallel to the axis "a" when rotated by 180 degrees makes an obtuse angle with the C-plane, whereas, the surface to be etched in a vertical direction makes an acute angle with the C-plane. Therefore, the shape of projections 40 formed by etching becomes the shape that is different from that of projections 1, as described hereinafter.

The thus formed projections 40 of Embodiment 8 are the same as projections 1 of Embodiment 7 in that a bottom surface has a substantially triangular shape and also each side of a bottom surface thereof includes a depression in the center. As is apparent from a comparison between FIG. 9 and FIG. 12, the proportion occupied by the inclined side 40a based on the entire surface area in projections 40 increases and the proportion occupied by the top surface 40b relatively decreases. In Embodiment 8, paying attention to the space between two adjacent projections 40, an outer periphery shape of a protruded portion of one projection 40 has the same shape as that of the depressed side of the other projection 40, and a C-plane of a sapphire substrate is formed in almost the same width between the protruded portion of one projection 40 and the depressed side of the other projection 40. Whereby, the C-plane of a sapphire substrate between three projections 1 extends in a substantially triangular shape in Embodiment 7, whereas, the C-plane of a sapphire substrate located between three projections 40 is formed in almost the same width and becomes narrow in Embodiment 8. As described above, projections 40 of Embodiment 8 can widen an area of a bottom surface of projections 40 as compared with an area of a bottom surface of projections 1 of Embodiment 7. As a result, an area of the C-plane of a sapphire substrate between projections 40 can be decreased.

Accordingly, when a nitride semiconductor is grown on a surface of the sapphire substrate on which projections 40 of Embodiment 8 are formed, the proportion of the nitride semiconductor grown in a lateral direction can be increased and dislocation of the grown nitride semiconductor can be decreased.

As described above, in the sapphire substrate of Embodiment 8, each side of a bottom surface of projections 40 respectively includes a depression in the center and can be arranged so that a straight line passes through the inside of at least any one of projections 32 when the straight line is drawn at any position in any direction on a surface of the sapphire substrate. In addition, the proportion of the nitride semiconductor grown in a lateral direction can be increased and dislocation of the grown nitride semiconductor can be decreased.

In the above Embodiment 8, as most preferable example, the above three directions in projections 40 were allowed to agree with those in which the axis "a" (axis a1, axis a2 and axis a3) is rotated clockwise (right-handed) by 30 degrees. However, the present invention is not limited thereto. For example, when the above three directions in projections 40 are adjusted within a range of ±10 degrees of the direction in which the axis "a" is rotated clockwise by 30 degrees, the same operation and effect as in Embodiment 8 can be obtained.

Embodiment 9

Figure 14:
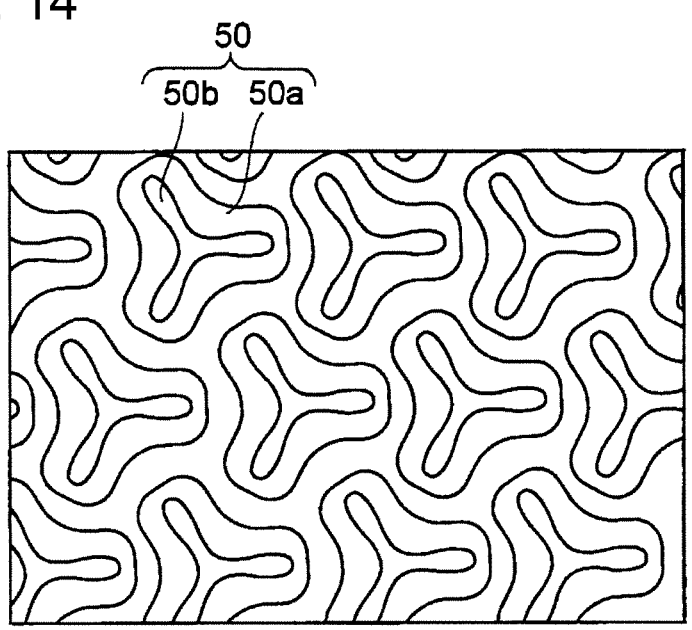
FIG. 14 is a plan view showing the constitution and arrangement of projections in a sapphire substrate according to Embodiment 9 of the present invention.

In a plan view of FIG. 14, the shape and the arrangement of projections 50 in a sapphire substrate according to Embodiment 9 of the present invention are shown.

Projections 50 in the sapphire substrate of Embodiment 9 are formed in the sense in which projections 1 of Embodiment 7 are rotated by 180 degrees, similar to projections 40 of Embodiment 8. However, the constitution of a top surface 50b of projections 50 is different from that of a top surface 40b of projections 40 of Embodiment 8. Specifically, the top surface 50b of Embodiment 9 is depressed in the center of projections 50 and the top surface 50b is a surface inclined from the sapphire C-plane.

In the sapphire substrate of Embodiment 9 including a plurality of projections 50 thus formed on one principal surface, the area of a C-plane of a sapphire substrate between projections 50 can be decreased by increasing the proportion of the inclined side 50a of projections 50, and also the growth of a nitride semiconductor on the top surface 50b of projections 50, which is a surface inclined from the sapphire C-plane can be suppressed, similar to the sapphire substrate of Embodiment 8. Whereby, the sapphire substrate of Embodiment 9 can further decrease the area occupied by a C-plane based on the entire one principal surface, and thus enabling the growth of a nitride semiconductor with less threading dislocation. In addition, there are following advantages.

That is, when the nitride semiconductor is grown on a top surface of projections, the height of projections increases and supply of a raw gas, that is usually supplied obliquely, is disturbed by projections, and thus pores (voids) are likely to generate at the root of projections. In contrast, like the present invention, when at least a part, preferably entirety of a top surface 50b of projections 50 is a surface that is not a sapphire C-plane, the growth of a nitride semiconductor on the top surface 50b is suppressed, and thus the generation of pores (voids) can be suppressed. Furthermore, in the sapphire substrate of Embodiment 9, since a depression is formed in the center of a top surface of projections is formed, a raw gas sufficiently reaches even the depression portion of a bottom surface of projections, and thus the generation of pores (voids) can be suppressed more effectively. Projections 50 including the top surface 50b composed of a surface that is not a sapphire C-plane can be produced by appropriately adjusting the mask shape. In order to form the top surface 50b with a surface that is not a sapphire C-plane without increasing an area of a C-plane of a sapphire substrate between projections 50, an interval between masks may be appropriately adjusted.

Embodiment 10

Figure 16A:
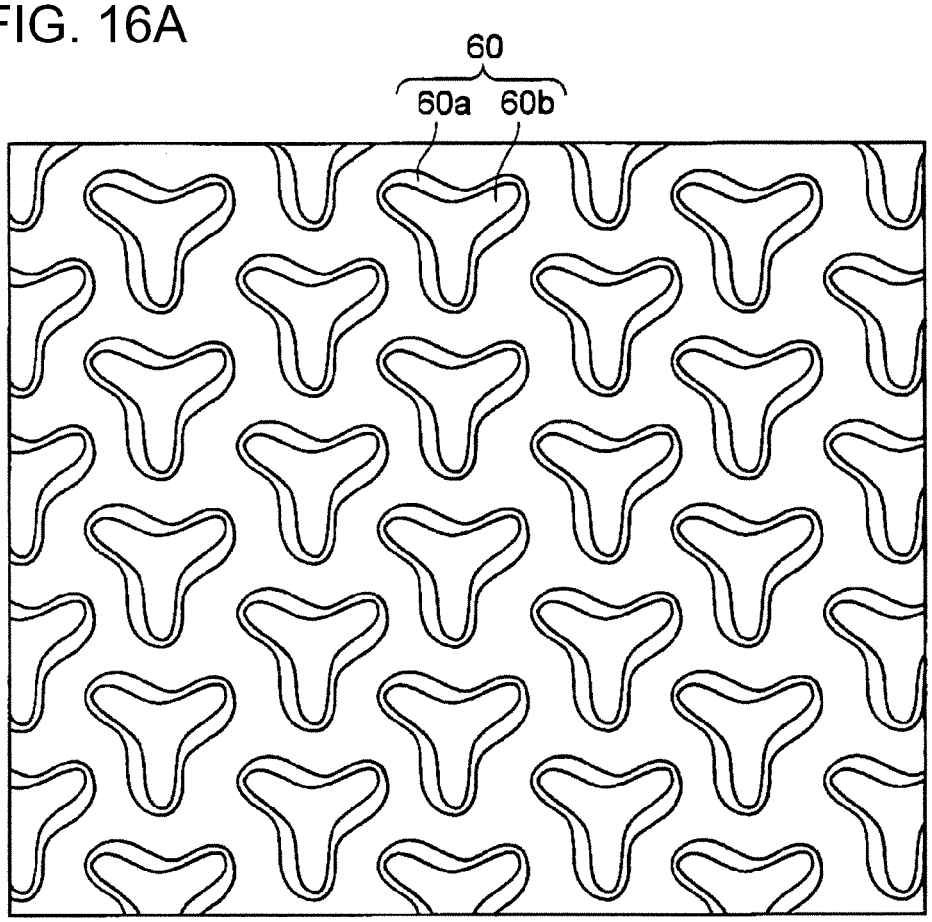
FIG. 16A is a plan view showing the constitution and arrangement of projections in a sapphire substrate according to Embodiment 10 of the present invention.
Figure 16B:
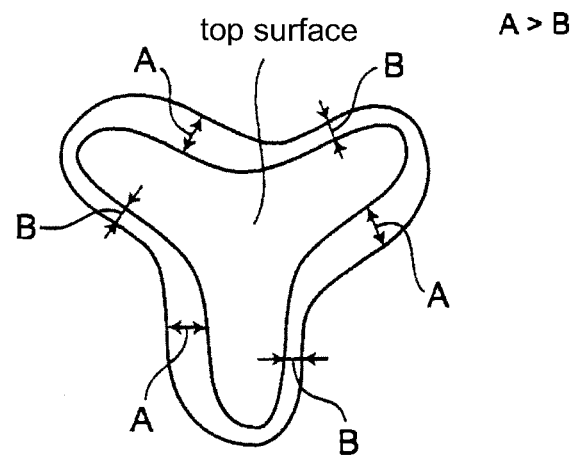
FIG. 16B is a plan view enlargely showing the constitution of projections of Embodiment 10.
Figure 17:
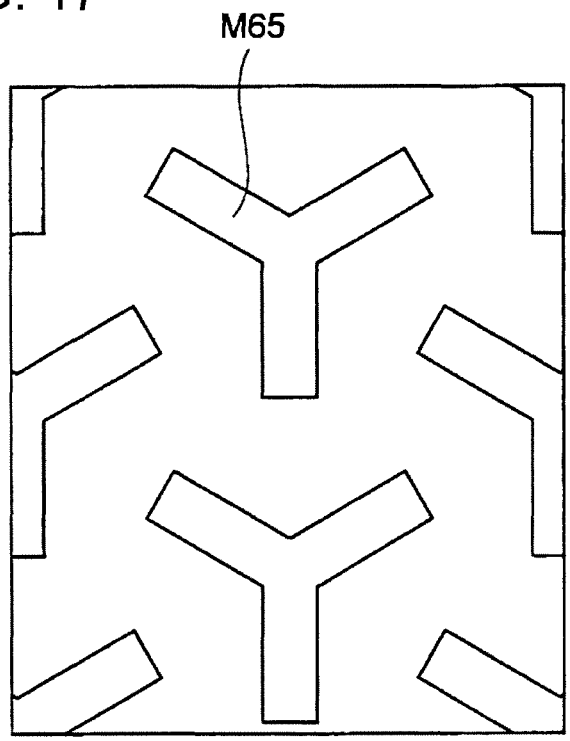
FIG. 17 is a plan view showing an example of a mask used when projections according to Embodiment 10 of the present invention is formed on a sapphire substrate.

In a plan view of FIG. 16A, the shape and the arrangement of projections 60 in a sapphire substrate according to Embodiment 10 of the present invention are shown. In FIG. 16B, projections 60 of FIG. 16A are enlargely shown. As shown in FIG. 16A and FIG. 16B, projections 60 include an inclined side 60a and a top surface 60b.

In this sapphire substrate of Embodiment 10, projections 60 are formed in the sense in which projections 1 of Embodiment 7 are rotated clockwise by 30 degrees.

Figure 18:
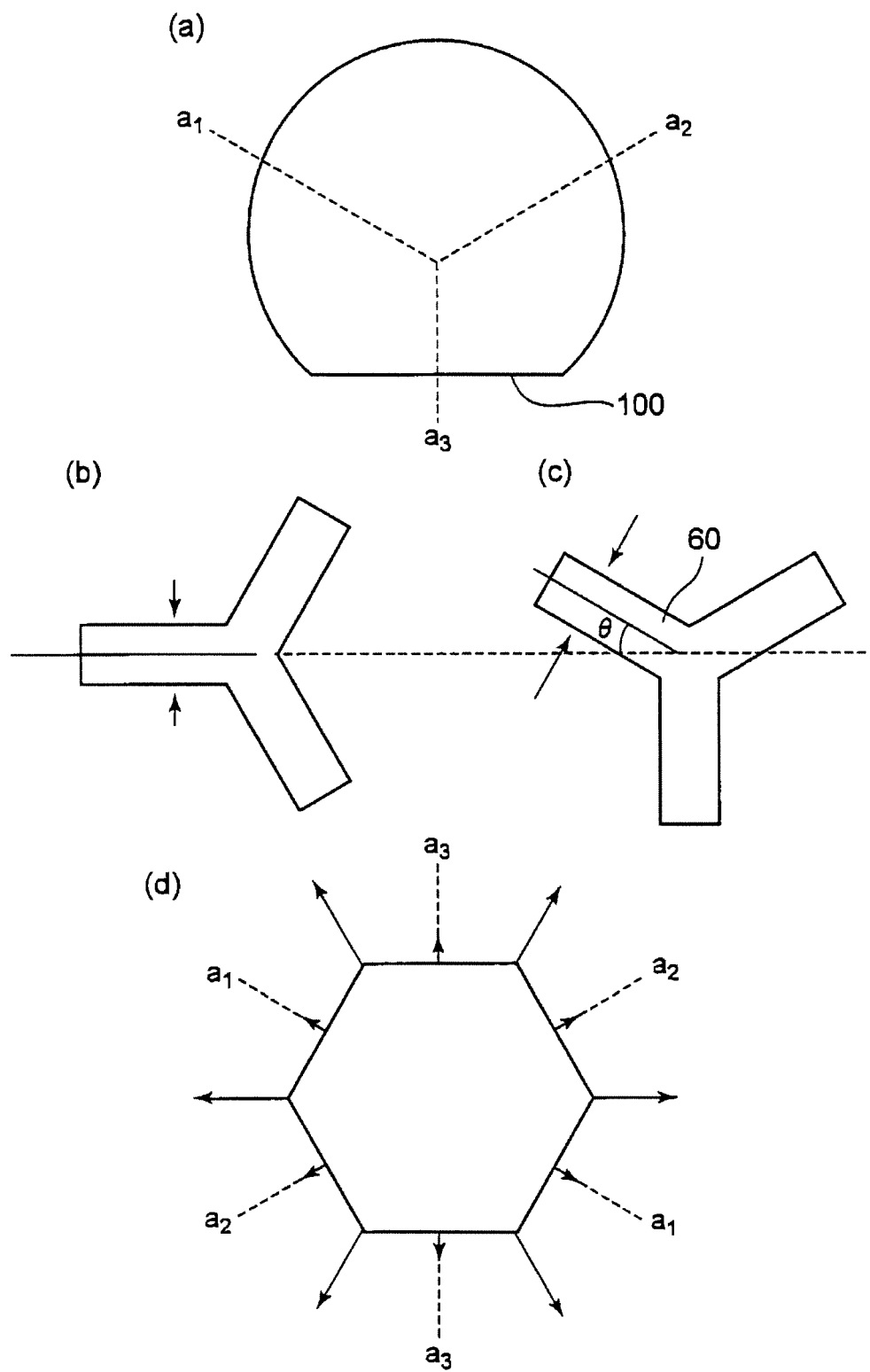
FIG. 18(a) is a plan view showing an orientation flat (plane A) and a crystal axis (axis a) of a sapphire wafer, FIGS. 18 (b) and 18(c) are plan views schematically showing a direction of projections and a growth rate of a nitride semiconductor.
FIG. 18(d) is a schematic view showing crystal orientation dependence of sapphire of a growth rate of a nitride semiconductor.

That is, as shown in FIG. 18(a) and FIG. 18(c), projections 60 of Embodiment 10 are formed so that three directions from the center toward the vertex in a bottom surface of projections 60, each having a substantially triangular shape, agree with the axis "a". In a sapphire substrate of Embodiment 10, a plurality of projections 60 are arranged in the direction that agrees with the axis "a".

Projections 60 can be formed by forming a mask M65 formed so that three directions from the center toward the tip agree with the axis "a" on a C-plane of a sapphire substrate in the direction that agrees with the axis "a", followed by etching. When the sapphire substrate is etched using the mask M65 thus formed, the direction that is easily etched and the direction that is scarcely etched are formed (etching anisotropy appears). Therefore, as shown in FIG. 16A and FIG. 16B, a width A of an inclined side becomes larger than a width B of the other inclined side at one side of the axis "a" and thus an area of the inclined side 60a increases. As a result, an area of a C-plane of a sapphire substrate formed between projections 60 can be decreased, and thus threading dislocation in case of growing a nitride semiconductor can be decreased.

Furthermore, in the sapphire substrate of Embodiment 10, since projections 60 are formed so that the extended portion extending in three directions from the center toward the tip agrees with the axis "a", a rate of the growth in a lateral direction, that covers projections 60 of a nitride semiconductor grown from a C-plane between projections 60, increases and flattening of the nitride semiconductor to be grown is promoted, and thus it becomes possible to form a more flat nitride semiconductor layer Describing in detail, the nitride semiconductor to be grown on a sapphire C-plane slowly grows in the direction of the axis "a" and quickly grows in the direction rotated from the axis "a" by 30 degrees, as shown in FIG. 18(d). As a result, the nitride semiconductor in the direction that intersects with the axis "a" grows more quickly. Accordingly, the extended portion extending in the direction that agrees with the axis "a" of projections 60 is quickly covered with the nitride semiconductor grown from both sides thereof (FIG. 18(c)).

As described above, according to the sapphire substrate of Embodiment 10, it becomes possible to decrease threading dislocation in case of growing a nitride semiconductor and to form a more flat nitride semiconductor layer.

In the above Embodiment 10, as most preferable example, the above three directions in projections 60 was allowed to agree with the axis "a". However, the present invention is not limited thereto. For example, the same operation and effect as in Embodiment 10 can be obtained by adjusting the above three directions in projections 60 within a range of the axis "a" ±10 degrees.

Embodiment 11

Figure 19:
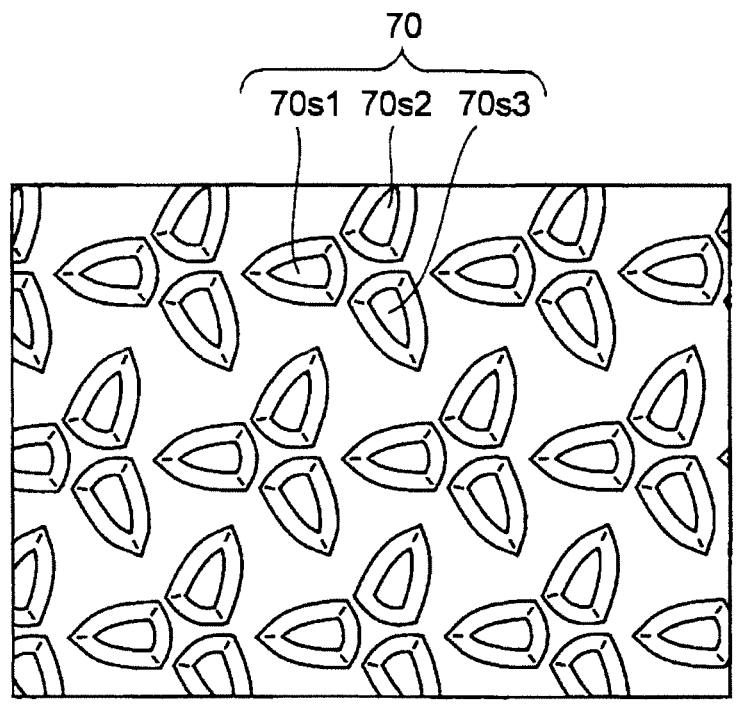
FIG. 19 is a plan view showing the constitution and arrangement of projections in a sapphire substrate according to Embodiment 11 of the present invention.

In a plan view of FIG. 19, the shape and the arrangement of projections 70 in a sapphire substrate according to Embodiment 11 of the present invention is shown.

Projections 70 in the sapphire substrate of Embodiment 11 is composed of a subprojection 70s1, a subprojection 70s2 and a subprojection 70s3 in the form where projections 1 having a petal shape in Embodiment 7 are separated in the center. When projections 70 are separated in the center, the portion of a triangular shape through which light is capable of going straight is formed between subprojections 70s1, 70s2, 70s3 on one principal surface of the sapphire substrate of Embodiment 11, and three subprojections 70s1, 70s2, 70s3 are proximal to each other. Therefore, even in case of the constitution of projections 70 in Embodiment 11, similar to projections 1, each having a petal shape, in Embodiment 7, projections 70 can be arrange so that a straight line passes through the inside of at least any one of projections 70 when the straight line is drawn at any position in any direction on a surface of a sapphire substrate on which projections 70 are formed.

Figure 20:
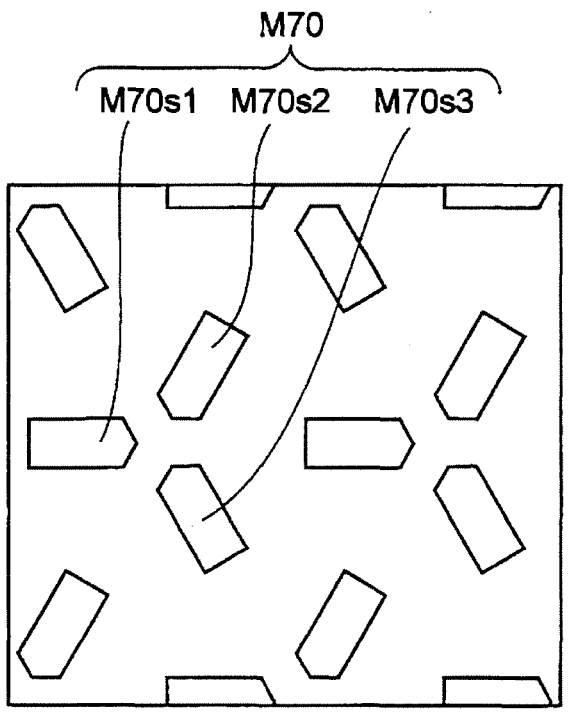
FIG. 20 is a plan view of a mask used when projections according to Embodiment 11 of the present invention is formed on a sapphire substrate.

Projections 70 separated in the center can be formed by forming a mask 70 composed of masks M70a1, M70a2, M70a3 separated in the center as shown in FIG. 20 in the predetermined arrangement and etching a sapphire substrate. The shape of the portion to be separated can be adjusted by a shape of tip portions facing each other of masks M70a1, M70a2, M70a3 as shown in FIG. 20.

In the sapphire substrate constituted as described above of Embodiment 11, projections 70 separated into subprojections 70s1, 70s2, 70s3 are formed on one principal surface. Whereby, when a nitride semiconductor is grown on a sapphire C-plane on which projections 70 are formed, the occurrence of voids can be prevented without suppression of the supply of a raw gas in the center of projections 70.

Embodiment 12

Figure 21:
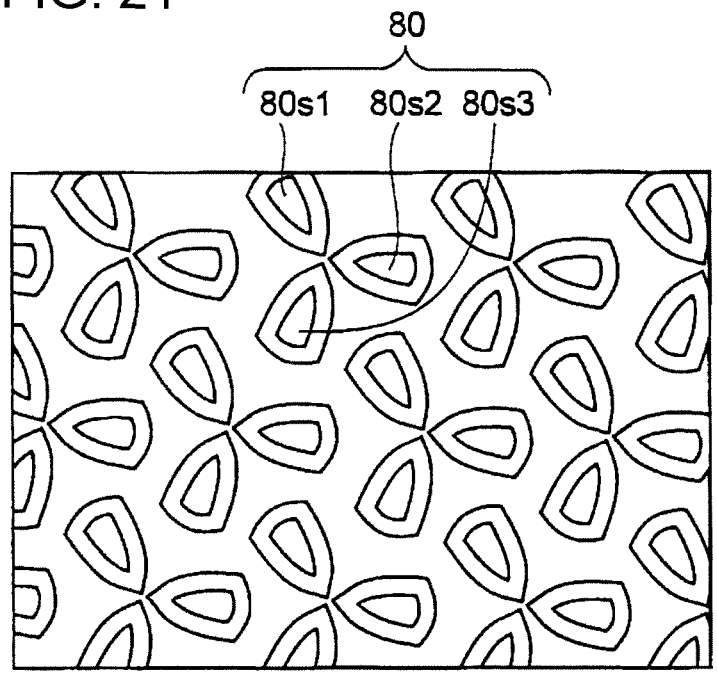
FIG. 21 is a plan view showing the constitution and arrangement of projections in a sapphire substrate according to Embodiment 12 of the present invention.

In a plan view of FIG. 21, the shape and the arrangement of projections 80 in a sapphire substrate according to Embodiment 12 of the present invention are shown.

Projections 80 in the sapphire substrate of Embodiment 12 is composed of a subprojection 80s1, a subprojection 80s2 and a subprojection 80s3 in the form where projections 40 having a petal shape in Embodiment 8 are separated in the center. When projections 80 are separated in the center, the gap through which light is capable of going straight is formed between subprojections 80s1, 80s2, 80s3 on one principal surface of the sapphire substrate of Embodiment 12, and three subprojections 80s1, 80s2, 80s3 are proximal to each other. Therefore, even in case of the constitution of projections 80 in Embodiment 12, similar to projections 40, each having a petal shape, in Embodiment 8, projections 80 can be arrange so that a straight line passes through the inside of at least any one of projections 80 when the straight line is drawn at any position in any direction on a surface of a sapphire substrate on which projections 40 are formed.

Figure 22:
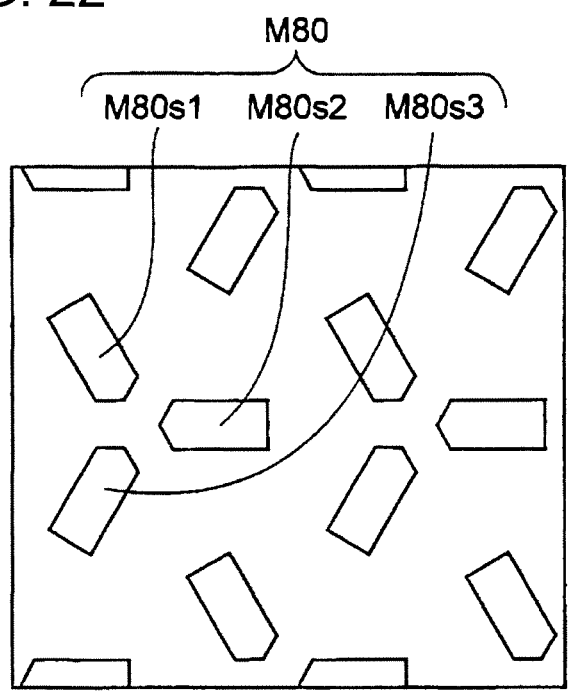
FIG. 22 is a plan view of a mask used when projections according to Embodiment 12 of the present invention is formed on a sapphire substrate.

Projections 80 separated in the center can be formed by forming a mask 70 composed of masks M80a1, M80a2, M80a3 separated in the center as shown in FIG. 22 in the predetermined arrangement and etching a sapphire substrate. The reason why the shape of the portion to be separated is different from that in Embodiment 11 shown in FIG. 19 is due to direction anisotropy of an etching rate of the sapphire substrate since projections 80 of Embodiment 12 are formed in the sense in which projections 70 of Embodiment 11 are rotated by 180 degrees.

In the sapphire substrate constituted as described above of Embodiment 12, projections 80 separated into subprojections 80s1, 80s2, 80s3 are formed on one principal surface. Whereby, when a nitride semiconductor is grown on a sapphire C-plane on which projections 80 are formed, the occurrence of voids can be prevented without suppression of the supply of a raw gas in the center of projections 80.

BRIEF DESCRIPTION OF REFERENCE NUMERALS 1, 2, 31, 32, 40, 50, 60, 70, 80: Projection
1a, 40a, 50a, 60a, 70a, 80a: Inclined side of projection
1b, 40b, 50b, 60b, 70b, 80b: Top surface of projection
10: Sapphire substrate
11, 12, 13: Side of bottom surface of projection
11a, 11b, 12a, 12b, 13a, 13b: Curved line
20: Semiconductor laminated structure
21: Base layer
22: First conductive layer (n-type layer)
23: Active layer (emissive layer)
24: Second conductive layer (p-type layer)
M1, M45, M65, M70, M80: Mask
70s1, 70s2, 70s3, 80s1, 80s2, 80s3: Subprojection
100: Orientation flat

The invention claimed is:

1. A sapphire substrate having a principal surface for growing a nitride semiconductor to form a nitride semiconductor light emitting device, the sapphire substrate comprising a plurality of projections on the principal surface,
wherein each projection of the plurality of projections is separated from each adjacent projection of the plurality of projections, wherein each of the projections has a bottom that has a substantially triangular shape, wherein each side of the bottom of the projections has a depression in its center, wherein extended portions of the bottoms of the respective projections extend in a direction that is within a range of ±10 degrees of a crystal axis "a" of the sapphire substrate, and wherein the plurality of projections are arranged so that any straight line that is drawn at any position in any direction in a plane including the bottoms of the plurality of projections passes through a geometric area of the bottom of at least one of projections.

2. The sapphire substrate according to claim 1, wherein each of the projections has a substantially pyramidal shape or substantially truncated pyramidal shape.

3. The sapphire substrate according to claim 1, wherein the plurality of projections are arranged so that a vertex of a bottom of a first projection among neighboring projections is located in a region defined by an imaginary triangle formed between points of two vertexes of a bottom of a second projection among the neighboring projections, and a deepest point of the depression in a corresponding side of the second projection.

4. The sapphire substrate according to claim 3, wherein said first projection of the neighboring projections is arranged so that the deepest portion of the depression of the second projection is located on a line that bisects an angle of a vertex of said first projection.

5. The sapphire substrate according to claim 3, wherein said first projection of the neighboring projections is arranged so that the deepest portion of the depression of the second projection is located on a line that bisects an angle of a vertex of a triangle formed by joining vertexes of said first projection.

6. The sapphire substrate according to claim 3, wherein the projections have a side surface that is inclined from the principal surface of said sapphire substrate, and wherein, in a plan view, a width of the side surface at a first side of the crystal axis "a" of said sapphire substrate is larger than a width of the side surface at a second side of the crystal axis "a" of said sapphire substrate.

7. The sapphire substrate according to claim 1, wherein each of the projections has a shape with linear symmetry over a straight line that connects a depression to a vertex opposite to a side including the depression.

8. The sapphire substrate according to claim 1, wherein each of the projections has a top surface that has a shape substantially similar to that of its bottom.

9. The sapphire substrate according to claim 1, wherein the plurality of projections are arranged so as to form a plurality of rows, and wherein the plurality of projections are arranged so that bisectors that bisect angles of vertexes of projections arranged in the same row are located on a straight line.

10. The sapphire substrate according to claim 9, wherein an orientation of projections forming a first row among neighboring rows is opposite to an orientation of projections forming a second row among the neighboring rows.

11. The sapphire substrate according to claim 1, wherein the plurality of projections are arranged in a plurality of groups of projections, each group of (n+1) projections being arranged at group vertexes and a group center of a substantially regular n-sided polygon.

12. The sapphire substrate according to claim 11, wherein at least one of the groups shares at least one projection with a neighboring group.

13. A nitride semiconductor light emitting device formed by growing a nitride semiconductor on the principal surface of the sapphire substrate according to claim 1.

14. The semiconductor light emitting device according to claim 13, wherein said nitride semiconductor layer grown on the principal surface of the sapphire substrate has a flat surface.

15. The semiconductor light emitting device according to claim 13, wherein said semiconductor light emitting device has a structure in which a base layer, an n-type layer, an active layer and a p-type layer are sequentially laminated, and wherein the projections of said sapphire substrate are buried in said base layer.

16. The sapphire substrate according to claim 1, wherein each of the extended portions has a rounded distal end.

17. The sapphire substrate according to claim 1, wherein the depressions are curved depressions.

18. The sapphire substrate according to claim 1, wherein the projections have extended portions extending in three directions from a center toward respective tips of the projections.

19. The sapphire substrate according to claim 1, wherein the plurality of projections includes a plurality of adjacent projections that are all oriented in the same direction.

20. A nitride semiconductor light emitting device formed by growing a nitride semiconductor on the principal surface of the sapphire substrate according to claim 19.

21. A sapphire substrate having a principal surface for growing a nitride semiconductor to form a nitride semiconductor light emitting device, the sapphire substrate comprising a plurality of projections on the principal surface, wherein each of the projections has a bottom that has a substantially triangular shape, wherein each side of the bottom of the projections has a depression in its center, wherein extended portions of the bottoms of the respective projections extend in a direction that is within a range of ±10 degrees of a crystal axis "a" of the sapphire substrate, and wherein the plurality of projections includes a plurality of adjacent projections that are all oriented in the same direction.

22. A nitride semiconductor light emitting device formed by growing a nitride semiconductor on the principal surface of the sapphire substrate according to claim 21.

23. A sapphire substrate having a principal surface for growing a nitride semiconductor to form a nitride semiconductor light emitting device, the sapphire substrate comprising a plurality of projections on the principal surface, wherein each of the projections has a bottom that has a substantially triangular shape, wherein each side of the bottom of the projections has a depression in its center, wherein extended portions of the bottoms of the respective projections extend in a direction that is within a range of ±10 degrees of a crystal axis "a" of the sapphire substrate, and wherein the plurality of projections are arranged so that a vertex of a bottom of a first projection among neighboring projections is located in a region defined by an imaginary triangle formed between points of two vertexes of a bottom of a second projection among the neighboring projections, and a deepest point of the depression in a corresponding side of the second projection.

24. The sapphire substrate according to claim 23, wherein said first projection of the neighboring projections is arranged so that the deepest portion of the depression of the second projection is located on a line that bisects an angle of a vertex of said first projection.

25. The sapphire substrate according to claim 23, wherein said first projection of the neighboring projections is arranged so that the deepest portion of the depression of the second projection is located on a line that bisects an angle of a vertex of a triangle formed by joining vertexes of said first projection.

26. The sapphire substrate according to claim 23, wherein the projections have a side surface that is inclined from the principal surface of said sapphire substrate, and wherein, in a plan view, a width of the side surface at a first side of the crystal axis "a" of said sapphire substrate is larger than a width of the side surface at a second side of the crystal axis "a" of said sapphire substrate.

* * * * *